(12) United States Patent
Nakamura

(10) Patent No.: US 9,704,775 B2
(45) Date of Patent: Jul. 11, 2017

(54) METHOD FOR MANUFACTURING THERMAL INTERFACE SHEET

(71) Applicant: FUJITSU LIMITED, Kawasaki-shi, Kanagawa (JP)

(72) Inventor: Naoaki Nakamura, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/285,206

(22) Filed: Oct. 4, 2016

(65) Prior Publication Data

US 2017/0047269 A1    Feb. 16, 2017

Related U.S. Application Data

(62) Division of application No. 14/524,047, filed on Oct. 27, 2014, now abandoned.

(30) Foreign Application Priority Data

Nov. 1, 2013    (JP) .................................. 2013-227997

(51) Int. Cl.
*H01L 21/00* (2006.01)
*H01L 23/373* (2006.01)
(Continued)

(52) U.S. Cl.
CPC ........ *H01L 23/3736* (2013.01); *B23K 1/0016* (2013.01); *B23K 35/26* (2013.01); *C22C 28/00* (2013.01); *H01L 21/4871* (2013.01); *H01L 23/42* (2013.01); *H01L 24/27* (2013.01); *H01L 24/29* (2013.01); *H01L 24/83* (2013.01); *H01L 23/16* (2013.01); *H01L 24/13* (2013.01); *H01L 24/16* (2013.01); *H01L 24/32* (2013.01); *H01L 24/73* (2013.01); *H01L 2224/13111* (2013.01);
(Continued)

(58) Field of Classification Search
CPC ....... H01L 21/4871; H01L 2224/29012; H01L 2224/29013; H01L 2224/29014; H01L 2224/29109; H01L 2224/29111; H01L 2224/29113; H01L 2224/29139; H01L 2224/29147; H01L 2224/32245; H01L 2224/73253; H01L 23/3736; H01L 24/27; H01L 24/29; H01L 2924/014
See application file for complete search history.

(56) References Cited

U.S. PATENT DOCUMENTS

2003/0150604 A1\* 8/2003 Koning ................... F28F 13/00
                                                                      165/185
2006/0220226 A1   10/2006 Renavikar et al.
(Continued)

FOREIGN PATENT DOCUMENTS

JP    H03-47673 A       2/1991
JP    2007-335742 A    12/2007
(Continued)

OTHER PUBLICATIONS

Japanese Office Action issued in corresponding Japanese Patent Application No. 2013-227997 on Apr. 21, 2017.

*Primary Examiner* — Duy T Nguyen
(74) *Attorney, Agent, or Firm* — Squire Patton Boggs (US) LLP

(57) ABSTRACT

A thermal interface sheet includes a peripheral portion, in a surface direction, configured to have a melting point higher than the melting point of a central portion in the surface direction.

4 Claims, 5 Drawing Sheets

(51) Int. Cl.
*H01L 23/42* (2006.01)
*B23K 1/00* (2006.01)
*B23K 35/26* (2006.01)
*C22C 28/00* (2006.01)
*H01L 21/48* (2006.01)
*H01L 23/16* (2006.01)
*H01L 23/00* (2006.01)

(52) U.S. Cl.
CPC ............ *H01L 2224/16225* (2013.01); *H01L 2224/271* (2013.01); *H01L 2224/2711* (2013.01); *H01L 2224/29012* (2013.01); *H01L 2224/29013* (2013.01); *H01L 2224/29014* (2013.01); *H01L 2224/2919* (2013.01); *H01L 2224/29076* (2013.01); *H01L 2224/29109* (2013.01); *H01L 2224/29111* (2013.01); *H01L 2224/29113* (2013.01); *H01L 2224/29139* (2013.01); *H01L 2224/29147* (2013.01); *H01L 2224/32225* (2013.01); *H01L 2224/32245* (2013.01); *H01L 2224/73204* (2013.01); *H01L 2224/73253* (2013.01); *H01L 2224/83101* (2013.01); *H01L 2224/83815* (2013.01); *H01L 2924/00011* (2013.01); *H01L 2924/014* (2013.01); *H01L 2924/10253* (2013.01); *H01L 2924/15311* (2013.01); *H01L 2924/16195* (2013.01); *H01L 2924/3511* (2013.01); *Y10T 428/12458* (2015.01)

(56) References Cited

U.S. PATENT DOCUMENTS

| | | |
|---|---|---|
| 2007/0013054 A1 | 1/2007 | Ruchert et al. |
| 2007/0152331 A1* | 7/2007 | Kang ............... B23K 35/025 257/737 |
| 2007/0217476 A1 | 9/2007 | Yoshikawa et al. |
| 2007/0290310 A1 | 12/2007 | Kusano et al. |
| 2009/0075102 A1 | 3/2009 | Brese et al. |
| 2010/0328895 A1 | 12/2010 | Bhagwagar et al. |
| 2012/0018890 A1 | 1/2012 | Nakamura et al. |
| 2014/0007987 A1* | 1/2014 | Prest .................. C22F 1/00 148/526 |
| 2014/0061893 A1* | 3/2014 | Saeidi ................ H01L 23/16 257/712 |

FOREIGN PATENT DOCUMENTS

| | | |
|---|---|---|
| JP | 2009-161850 A | 7/2009 |
| JP | 2010-539683 A | 12/2010 |

* cited by examiner

METHOD FOR MANUFACTURING THERMAL INTERFACE SHEET

CROSS-REFERENCE TO RELATED APPLICATION

This application is a Divisional of application Ser. No. 14/524,047, filed on Oct. 27, 2014, which claims the benefit of priority of the prior Japanese Patent Application No. 2013-227997, filed on Nov. 1, 2013, the entire contents of which are incorporated herein by reference.

FIELD

The embodiments discussed herein are related to a thermal interface sheet configured to dissipate heat from a semiconductor element effectively and a processor including a thermal interface layer formed from the above-described thermal interface sheet.

BACKGROUND

In recent years, in order to cope with an increase in an amount of heat generation along with enhancement in performance of a semiconductor device, high thermal conduction of a central processing unit (CPU) package structure is realized by using solder serving as a thermal interface material (TIM) between a large scale integration (LSI) and a heat spreader.

For example, a composite material including a thermally conductive metal and silicone particles in the above-described thermally conductive metal (for example, refer to Japanese National Publication of International Patent Application No. 2010-539683), a complex including a homogeneously dispersed material of an indium metal and at least one type of ceramic material and having a thermal conductivity of at least 80 W/mK (for example, refer to Japanese Laid-open Patent Publication No. 2009-161850), and a TIM serving as a phase change portion composed of at least one type of low-melting point metal selected from the group consisting of Ga, In, and Sn or an alloy containing the above-described at least one type of low-melting point metal (for example, refer to Japanese Laid-open Patent Publication No. 2007-335742) have been proposed as the above-described TIM.

In general, it is known that voids are generated at a junction interface of soldering. In the case where the TIM is used, voids lead to reduction in the cooling efficiency and high-temperature irregularity of a device and, therefore, a junction with reduced voids is desired.

However, with respect to the thermal interface materials (TIMs) in the related art including the above-described technologies which have been proposed already, a junction with reduced voids has not been realized because removal of generated voids from the junction surface is difficult.

SUMMARY

According to an aspect of the invention, a thermal interface sheet includes a peripheral portion, in a surface direction, configured to have a melting point higher than the melting point of a central portion in the surface direction.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Thermal Interface Sheet

Figure 1A:
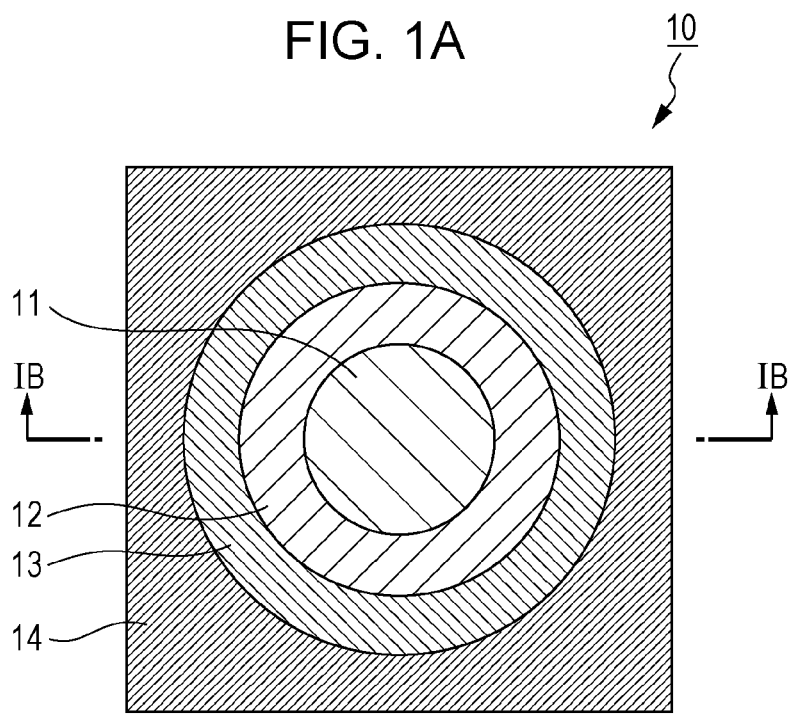
FIG. 1A is a schematic top view illustrating an example of a thermal interface sheet.

A disclosed thermal interface sheet includes a peripheral portion, in a surface direction of the above-described thermal interface sheet, configured to have a melting point higher than the melting point of a central portion in the above-described surface direction.

The above-described thermal interface sheet is favorably used for joining a semiconductor element and a heat spreader.

The above-described thermal interface sheet is a sheet having excellent thermal conductivity and may be referred to as a thermally conductive sheet.

Preferably, the melting point of the above-described thermal interface sheet may increase stepwise from the central portion in the surface direction of the above-described thermal interface sheet toward the peripheral portion in the surface direction of the above-described thermal interface sheet.

Preferably, the melting point of the above-described thermal interface sheet may increase little by little from the central portion in the surface direction of the above-described thermal interface sheet toward the peripheral portion in the surface direction of the thermal interface sheet.

The material for the above-described thermal interface sheet is not specifically limited and may be selected appropriately in accordance with the purpose, although it is preferable that solder be contained.

The above-described solder is not specifically limited and may be selected appropriately in accordance with the purpose. For example, In—Ag solder, Sn—Cu solder, Sn—Ag—Cu solder, Sn—Ag—Cu—Bi solder, and the like are mentioned.

The above-described In—Ag solder may have various melting points depending on, for example, the composition ratio of In to Ag, as disclosed in Table 1.

TABLE 1

| | Melting point |
|---|---|
| In-5Ag | 280° C. |
| In-10Ag | 231° C. |
| In-7Ag | 200° C. |
| In-5Ag | 160° C. |
| In-3Ag | 141° C. |

As for the above-described solder, it is preferable that the solder be configured to contain In because In is mild and has excellent thermal conductivity. Usually, in many cases, the semiconductor element contains Si as a primary constituent component and the heat spreader contains Cu as a primary constituent component. Here, the thermal expansion coefficient of Si is 3 ppm/° C. and the thermal expansion coefficient of Cu is 17 ppm/° C. There is a difference in thermal expansion coefficient and, thereby, the thermal interface sheet may undergo thermal fatigue because of repetition of switching. In order to reduce the above-described thermal fatigue, it is preferable that In which is mild and capable of absorbing a thermal stress be used as the constituent component of the thermal interface sheet.

The above-described thermal interface sheet may be formed by using solder alloys configured to have different melting points depending on the composition ratio.

The average thickness of the above-described thermal interface sheet is not specifically limited and may be selected appropriately in accordance with the purpose. For example, 100 μm to 1 mm is mentioned.

The size and the shape of the above-described thermal interface sheet may be selected appropriately in accordance with sizes, shapes, and the like of a semiconductor element and the like to be joined.

An example of the above-described thermal interface sheet will be described with reference to drawings.

Figure 1B:
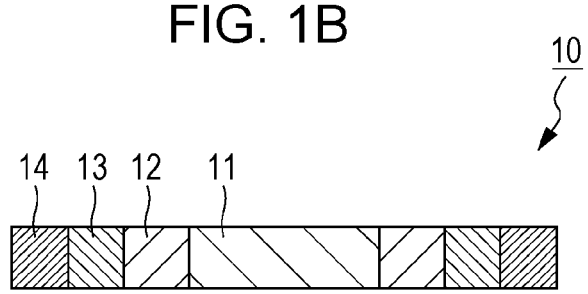
FIG. 1B is a sectional view of the section taken along a line IB-IB illustrated in FIG. 1A.

An example of the above-described thermal interface sheet is illustrated as FIG. 1A and FIG. 1B. FIG. 1A is a schematic top view of a thermal interface sheet 10. FIG. 1B is a sectional view of the section taken along a line IB-IB illustrated in FIG. 1A.

The thermal interface sheet 10 illustrated in FIG. 1A and FIG. 1B is composed of four types of solder configured to have different melting points and includes a first solder region 11, a second solder region 12, a third solder region 13, and a fourth solder region 14. The melting points of the individual solder regions satisfy the relationship represented by the first solder region 11<the second solder region 12<the third solder region 13<the fourth solder region 14. That is, the melting point of the thermal interface sheet 10 illustrated in FIG. 1A and FIG. 1B increases stepwise from the central portion in the surface direction of the thermal interface sheet 10 toward the peripheral portion in the surface direction of the thermal interface sheet 10.

The first solder region 11, the second solder region 12, and the third solder region 13 are concentric circles having different sizes in the top view.

Figure 2A:
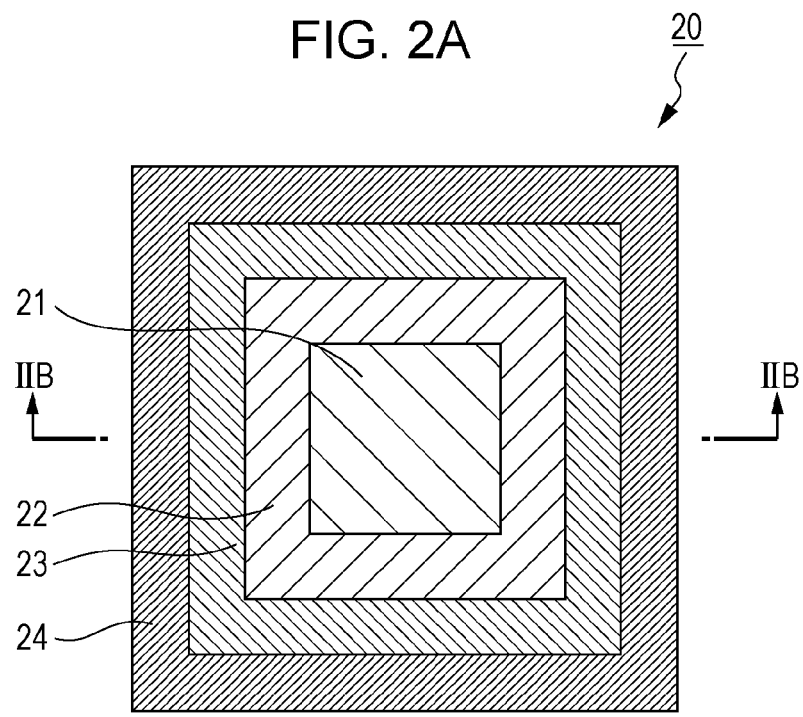
FIG. 2A is a schematic top view illustrating another example of the thermal interface sheet.
Figure 2B:
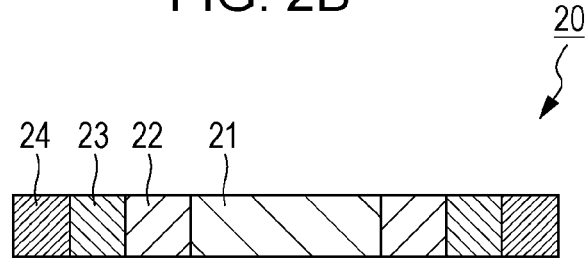
FIG. 2B is a sectional view of the section taken along a line IIB-IIB illustrated in FIG. 2A.

Another example of the above-described thermal interface sheet is illustrated as FIG. 2A and FIG. 2B. FIG. 2A is a schematic top view of a thermal interface sheet 20. FIG. 2B is a sectional view of the section taken along a line IIB-IIB illustrated in FIG. 2A.

The thermal interface sheet 20 illustrated in FIG. 2A and FIG. 2B is composed of four types of solder configured to have different melting points and includes a first solder region 21, a second solder region 22, a third solder region 23, and a fourth solder region 24. The melting points of the individual solder regions satisfy the relationship represented by the first solder region 21<the second solder region 22<the third solder region 23<the fourth solder region 24. That is, the melting point of the thermal interface sheet 20 illustrated in FIG. 2A and FIG. 2B increases stepwise from the central portion in the surface direction of the thermal interface sheet 20 toward the peripheral portion in the surface direction of the thermal interface sheet 20.

The first solder region 21, the second solder region 22, the third solder region 23, and the fourth solder region 24 are squares having different sizes in the top view.

Figure 3A:
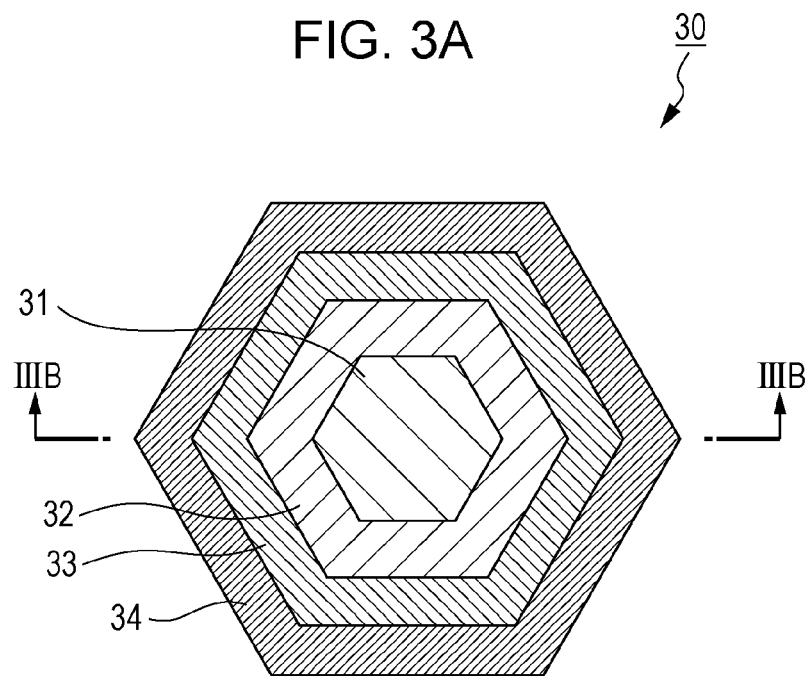
FIG. 3A is a schematic top view illustrating another example of the thermal interface sheet.
Figure 3B:
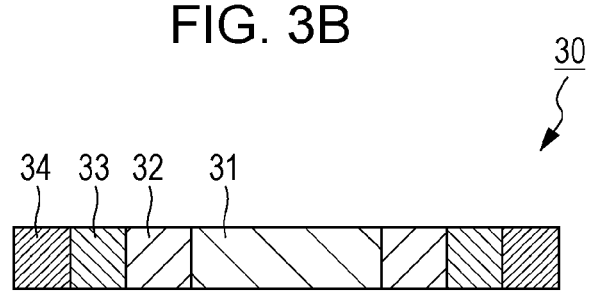
FIG. 3B is a sectional view of the section taken along a line IIIB-IIIB illustrated in FIG. 3A.

Another example of the above-described thermal interface sheet is illustrated as FIG. 3A and FIG. 3B. FIG. 3A is a schematic top view of a thermal interface sheet 30. FIG. 3B is a sectional view of the section taken along a line IIIB-IIIB illustrated in FIG. 3A.

The thermal interface sheet 30 illustrated in FIG. 3A and FIG. 3B is composed of four types of solder configured to have different melting points and includes a first solder region 31, a second solder region 32, a third solder region 33, and a fourth solder region 34. The melting points of the individual solder regions satisfy the relationship represented by the first solder region 31<the second solder region 32<the third solder region 33<the fourth solder region 34. That is, the melting point of the thermal interface sheet 30 illustrated in FIG. 3A and FIG. 3B increases stepwise from the central portion in the surface direction of the thermal interface sheet 30 toward the peripheral portion in the surface direction of the thermal interface sheet 30.

The first solder region 31, the second solder region 32, the third solder region 33, and the fourth solder region 34 are regular hexagons having different sizes in the top view.

Figure 4A:
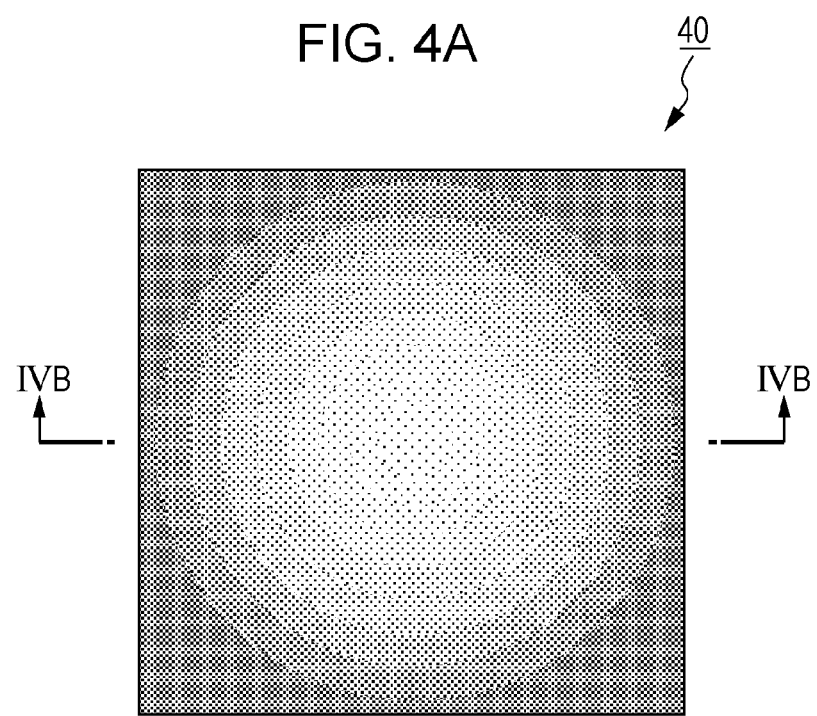
FIG. 4A is a schematic top view illustrating another example of the thermal interface sheet.
Figure 4B:
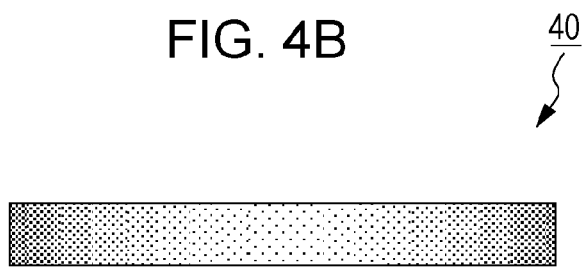
FIG. 4B is a sectional view of the section taken along a line IVB-IVB illustrated in FIG. 4A.

Another example of the above-described thermal interface sheet is illustrated as FIG. 4A and FIG. 4B. FIG. 4A is a schematic top view of a thermal interface sheet 40. FIG. 4B is a sectional view of the section taken along a line IVB-IVB illustrated in FIG. 4A.

In the thermal interface sheet 40 illustrated in FIG. 4A and FIG. 4B, solder is present, where the melting point varies without exhibiting a clear boundary. That is, the melting point of the thermal interface sheet 40 illustrated in FIG. 4A and FIG. 4B increases little by little from the central portion in the surface direction of the thermal interface sheet 40 toward the peripheral portion in the surface direction of the thermal interface sheet 40.

In FIG. 4A and FIG. 4B, the gradual change in the melting point of the thermal interface sheet 40 is expressed by stippling, where as the density of dots becomes low, the melting point becomes relatively low, and as the density of dots becomes high, the melting point becomes relatively high.

Figure 5:
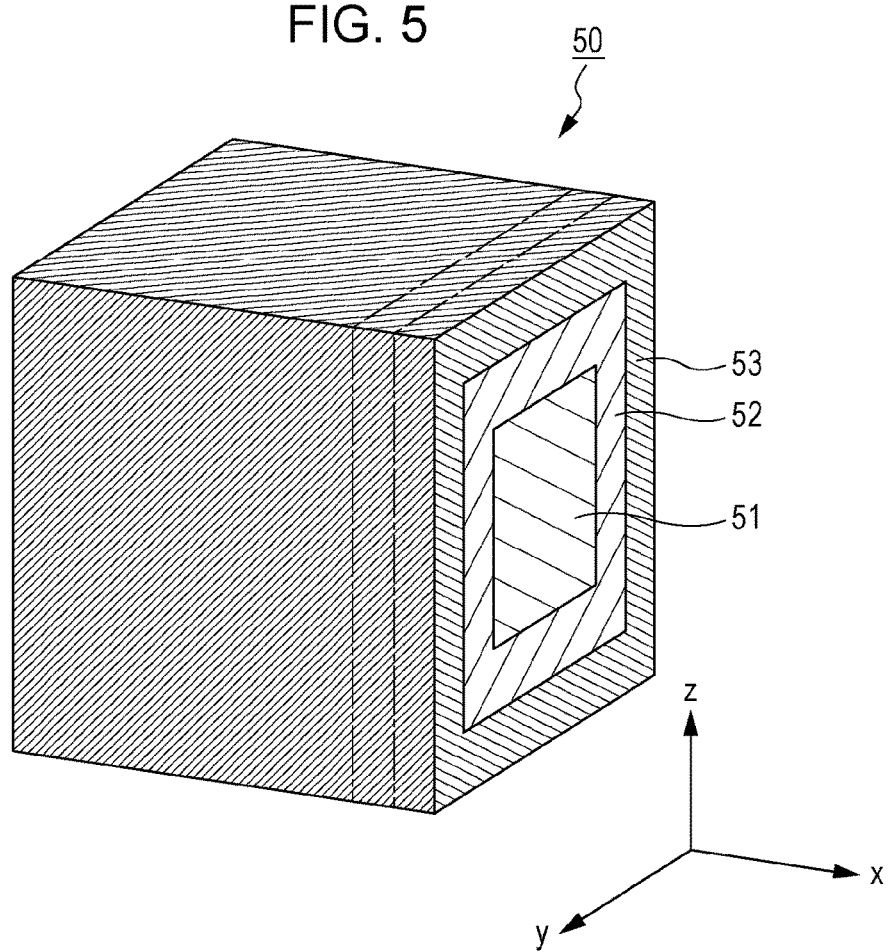
FIG. 5 is a schematic perspective view of an example of a thermal interface block to produce a thermal interface sheet.

A method for manufacturing the above-described thermal interface sheet is not specifically limited and may be selected appropriately in accordance with the purpose. Examples include a method in which a thermal interface block 50 illustrated as FIG. 5 is produced, and the thermal interface block 50 is cut along the alternate long and short lines illustrated in FIG. 5. A method for cutting is not specifically limited and may be selected appropriately in accordance with the purpose. For example, a method in which cutting is performed with an ultrasonic cutter is mentioned.

The thermal interface sheet block 50 illustrated as FIG. 5 includes a first solder region 51 in a central region and includes a second solder region 52 and a third solder region 53 in that order in the periphery thereof in a y-z plane. The melting points of the individual solder regions satisfy the relationship represented by the first solder region 51<the second solder region 52<the third solder region 53.

A method for manufacturing the thermal interface sheet 50 illustrated as FIG. 5 is not specifically limited and may be selected appropriately in accordance with the purpose. Examples include the following methods (1) to (4).

Method (1)

A method in which sheet-shaped second solder (solder to constitute the second solder region 52) is wound around quadratic prism-shaped solder formed from first solder to constitute the first solder region 51, and sheet-shaped third solder (solder to constitute the third solder region 53) is wound around them. In this method, when each sheet is wound, preferably, hot press is performed in such a way that each solder region is melted and is joined.

Method (2)

Quadratic prism-shaped solder formed from first solder to constitute the first solder region 51 is immersed into molten second solder (solder to constitute the second solder region 52), so that the second solder region 52 is formed around the first solder region 51. Subsequently, the quadratic prism-shaped solder provided with the second solder region 52 is immersed into molten third solder (solder to constitute the third solder region 53), so that the third solder region 53 is formed.

In immersion into the molten solder, it is preferable that the quadratic prism-shaped solder to be immersed is cooled sufficiently. Consequently, immersion may be performed while melting of the quadratic prism-shaped solder to be immersed is reduced.

According to this method, mainly, a thermal interface block may be formed, where the melting point increases stepwise from the central portion toward the peripheral portion in the y-z plane.

On the other hand, it is also possible to make the interfaces between the individual solder regions unclear by adjusting the temperature of the molten solder and the degree of cooling of the quadratic prism-shaped solder appropriately and, thereby, form a thermal interface block, where the melting point increases little by little from the central portion toward the peripheral portion in the y-z plane.

Method (3)

A quadratic prism-shaped core material having a sufficiently high melting point is immersed into molten second solder (solder to constitute the second solder region 52), so that the second solder region 52 is formed around the above-described quadratic prism-shaped core material. Subsequently, the above-described quadratic prism-shaped core material provided with the second solder region 52 is immersed into molten third solder (solder to constitute the third solder region 53), so that the third solder region 53 is formed. Thereafter, the core material is removed from the thermal interface block provided with the third solder region 53, first solder (solder to constitute the first solder region 51) is poured into the resulting central portion, and cooling is performed.

Method (4)

The inside surface of hollow quadratic prism-shaped solder made from third solder (solder to constitute the third solder region 53) is coated with molten second solder (solder to constitute the second solder region 52) and cooling is performed, so that the second solder region 52 is formed on the inside surface of the third solder region 53. Subsequently, molten first solder (solder to constitute the first solder region 51) is poured on the inside of the second solder region 52, and cooling is performed.

In the above-described method, the quadratic prism-shaped solder is used. However, the shape is not specifically limited and may be selected appropriately in accordance with the purpose. The shape of a circular column may be employed.

Processor

A disclosed processor includes at least a semiconductor element, a thermal interface layer, and a heat spreader and further includes other members, as occasion calls.

Semiconductor Element

The above-described semiconductor element is not specifically limited insofar as a circuit surface is included and may be selected appropriately in accordance with the purpose. Examples include integrated circuits and large scale integrated circuits.

Thermal Interface Layer

The above-described thermal interface layer is formed from the disclosed thermal interface sheet.

The above-described thermal interface layer is disposed on the surface opposite to the above-described circuit surface of the above-described semiconductor element.

Heat Spreader

The above-described heat spreader is not specifically limited and may be selected appropriately in accordance with the purpose. The heat spreader is formed from, for example, a material having good thermal conduction performance. The above-described heat spreader may be formed from Cu, Al, or a composite material based thereon, although oxygen-free-copper is preferable. The above-described heat spreader is disposed on the above-described thermal interface layer.

The size and the shape of the above-described heat spreader may be selected appropriately in accordance with the size, the shape, and the like of the above-described processor.

Examples of the above-described processor include a central processing unit (CPU), a digital signal processor (DSP), and a graphics processing unit (GPU).

An example of the above-described processor will be described with reference to FIG. 6.

Figure 6:
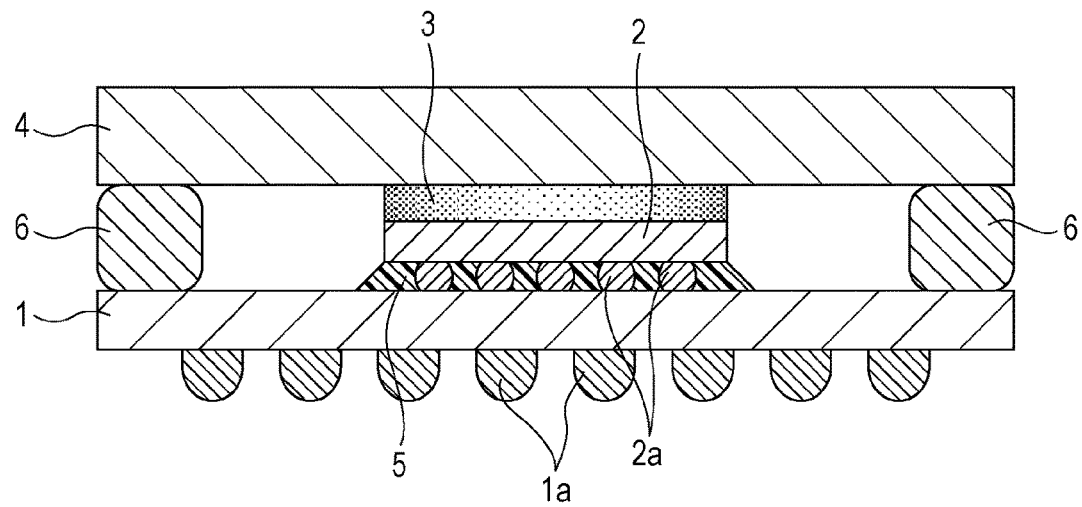
FIG. 6 is a schematic sectional view of an example of a disclosed processor.

FIG. 6 is a schematic sectional view of an example of the processor.

The processor illustrated as FIG. 6 includes a package substrate 1, a semiconductor chip 2 serving as the above-described semiconductor element, a thermal interface layer 3, a heat spreader 4, an underfill resin 5, and a stiffener 6.

The semiconductor chip 2 is mounted on the central portion of the package substrate 1. Connection bumps 1a are disposed on the back of the package substrate 1.

The stiffener 6 in the shape of a frame is fixed on the chip-mounting surface of the package substrate 1 in such a way as to surround the mounting area of the semiconductor chip 2. The stiffener 6 is used as a reinforcement to reduce harmful deformations, e.g., warp, of the package substrate 1 or breakage when an external force is applied to the package, and Cu or a stainless steel having a thermal expansion coefficient close to the thermal expansion coefficient of the package substrate 1 is used.

The semiconductor chip 2 is connected to connection lands on the package substrate 1 through the use of electrodes 2a disposed on the circuit surface. As for the electrode material, Sn—Ag solder, Sn—Pb solder, or the like is used.

In order to reduce break due to thermal fatigue of the junction portion with the package substrate 1, the underfill resin 5 having an insulating property is filled in the junction portion of the electrodes 2a with the package substrate 1. As for the underfill resin 5, a synthetic resin containing an epoxy resin as a primary component and having a thermal expansion coefficient of about 20 ppm/° C. to 80 ppm/° C. is used.

The thermal interface layer 3 formed from the thermal interface sheet is disposed between the surface opposite to the circuit surface of the semiconductor chip 2 and the heat spreader 4. The thermal interface layer 3 is formed by heating and melting the thermal interface sheet and is configured to solder-joining the semiconductor chip 2 and the heat spreader 4 and transfer the heat of the semiconductor chip 2 from the semiconductor chip 2 to the heat spreader 4.

In the case where the thermal interface sheet and the heat spreader 4 are stacked on the semiconductor chip 2 in that order, slight gaps (voids) are generated between the semiconductor chip 2 and the thermal interface sheet and between the thermal interface sheet and the heat spreader 4, and air (bubble (void)) is present there.

As for the thermal interface sheet in the related art, if heating is performed in that state, the thermal interface sheet is melted all at once. Therefore, the air present between the semiconductor chip 2 and the thermal interface sheet and between the thermal interface sheet and the heat spreader 4 is not transferred easily and remains as bubbles at the interface between the semiconductor chip 2 and the thermal interface sheet and at the interface between the thermal interface sheet and the heat spreader 4. The thermal conductivity of the air is low, so that if the air remains at the interface between the semiconductor chip 2 and the thermal interface sheet and at the interface between the thermal interface sheet and the heat spreader 4, transfer of the heat from the semiconductor chip 2 to the heat spreader 4 is reduced.

On the other hand, in the case where the above-described disclosed thermal interface sheet is used, when heating is performed, the thermal interface sheet begins to melt from the central portion in the surface direction. Consequently, when the molten central portion of the thermal interface sheet wets and spreads to the semiconductor chip 2 and the heat spreader 4, bubbles present at the interface between the semiconductor chip 2 and the thermal interface sheet and at the interface between the thermal interface sheet and the heat spreader 4 are pushed to the outside in the surface direction. As the thermal interface sheet is melted from the central portion toward the peripheral portion in the surface direction of the thermal interface sheet, bubbles are pushed to the outside in the surface direction. As a result, the air may be removed from the interface between the semiconductor chip 2 and the thermal interface sheet and the interface between the thermal interface sheet and the heat spreader 4.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method for manufacturing a thermal interface sheet, comprising:
    preparing a first solder region having a quadratic prism shape and being formed from a first solder;
    immersing the first solder region into a second solder which is melted so as to form a second solder region having a quadratic prism shape around the first solder region;
    immersing the first solder region and the second solder region into a third solder which is melted so as to form a third solder region having a quadratic prism shape around the second solder region; and
    cutting the first solder region, the second solder region and the third solder region,
    wherein a third melting point of the third solder is larger than a second melting point of the second solder and the second melting point is larger than a first melting point of the first solder.

2. The method according to claim 1, wherein the first solder region, the second solder region and the third region are provided concentrically.

3. The method according to claim 1, wherein the first solder region is cooled before being immersed into the second solder, and the first solder region and the second solder region are cooled before being immersed into the third solder.

4. The method according to claim 1, wherein the first solder region, the second solder region and the third solder region contain one of an In—Ag solder, a Sn—Cu solder, a Sn—Ag—Cu solder, and a Sn—Ag—Cu—Bi solder.

* * * * *